US007847516B2

(12) United States Patent
Kung et al.

(10) Patent No.: US 7,847,516 B2
(45) Date of Patent: Dec. 7, 2010

(54) CIRCUIT AND METHOD FOR DETECTING ABSENT BATTERY CONDITION IN A LINEAR CHARGER

(75) Inventors: Nien-Hui Kung, Hsinchu (TW); Kwan-Jen Chu, Hsinchu (TW)

(73) Assignee: Richtek Technology Corp., Hsinchu (TW)

( * ) Notice: Subject to any disclaimer, the term of this patent is extended or adjusted under 35 U.S.C. 154(b) by 114 days.

(21) Appl. No.: 12/078,887

(22) Filed: Apr. 8, 2008

(65) Prior Publication Data

US 2009/0237035 A1  Sep. 24, 2009

(30) Foreign Application Priority Data

Mar. 18, 2008   (TW) .............................. 97109522 A

(51) Int. Cl.
*H02J 7/06* (2006.01)
*H02J 7/24* (2006.01)

(52) U.S. Cl. ....................................... 320/106; 320/163

(58) Field of Classification Search ................. 320/106, 320/112, 114, 115, 134, 137, 162, 163
See application file for complete search history.

(56) References Cited

U.S. PATENT DOCUMENTS

| 6,240,854 B1* | 6/2001 | Heil ......................... 108/51.11 |
| 6,340,876 B1* | 1/2002 | Saint-Pierre ................. 320/106 |
| 7,479,765 B2* | 1/2009 | Kamatani ..................... 320/164 |
| 7,589,533 B2* | 9/2009 | Houldsworth ................ 324/426 |
| 2007/0052422 A1* | 3/2007 | Houldsworth ................ 324/426 |

* cited by examiner

*Primary Examiner*—Edward Tso
*Assistant Examiner*—Ramy Ramadan
(74) *Attorney, Agent, or Firm*—Rosenberg, Klein & Lee

(57) ABSTRACT

A circuit and method for detecting absent battery condition in a linear charger apply a detecting signal onto an output terminal of the charger and monitor the output terminal to receive a detected signal. The capacitance at the output terminal is significantly different between the presence and absence of a battery connected to the output terminal, and it is thus available to determine from the detected signal, if no battery is connected to the output terminal.

7 Claims, 3 Drawing Sheets

CIRCUIT AND METHOD FOR DETECTING ABSENT BATTERY CONDITION IN A LINEAR CHARGER

FIELD OF THE INVENTION

The present invention is related generally to a charger and, more particularly, to a circuit and method for detecting absent battery condition in a linear charger.

BACKGROUND OF THE INVENTION

A linear charger charges a battery with current, and therefore, if there is no battery, the output of the linear charger will quickly raise to a higher voltage due to the output current of the linear charger, thereby causing accumulation of heat and charges on the output terminal of the linear charger, which may damage the circuit of the linear charger. In state-of-art, there are two methods to protect a charger system, of which one is adding protection circuit to the system and the other is detecting the battery. In the second method, if there is no battery, the charger will be off or switched to another operation mode, and a no-battery signal could be sent to the system for further applications. For the second method, U.S. Pat. No. 5,291,118 to Kojima detects the no-battery condition with thermistor, U.S. Pat. No. 5,932,989 to Thandiwe et al. detects the present battery with EEPROM, and both of these arts rely on external component for the detection of battery connection. Alternatively, U.S. Pat. No. 6,340,876 to Saint-Piere detects the battery removal by the charger circuit itself, which monitors the charger positive and negative terminals to detect violate variation of charge voltage and charge current, to annunciate the current state of the charger.

SUMMARY OF THE INVENTION

The present invention is directed to an approach to detect if any battery is connected to a linear charger, without either external component or detection of charge current or discharge current, by only monitoring the output terminal of the charger.

Accordingly, an object of the present invention is to provide a circuit and method for detecting absent battery condition in a linear charger.

A circuit according to the present invention includes a signal generator and a signal detector both connected to an output terminal of a linear charger. The signal generator applies a detecting signal onto the output terminal, and the signal detector monitors the output terminal to thereby receive a detected signal.

A method according to the present invention includes applying a detecting signal onto an output terminal of a linear charger, and monitoring the output terminal to thereby receive a detected signal to determine.

Between the presence and absence of a battery connected to an output terminal of a linear charger, the capacitance at the output terminal is significantly different up to three order, and it is thus available to determine from the detected signal, if no battery is connected to the output terminal.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAIL DESCRIPTION OF THE INVENTION

Figure 1:
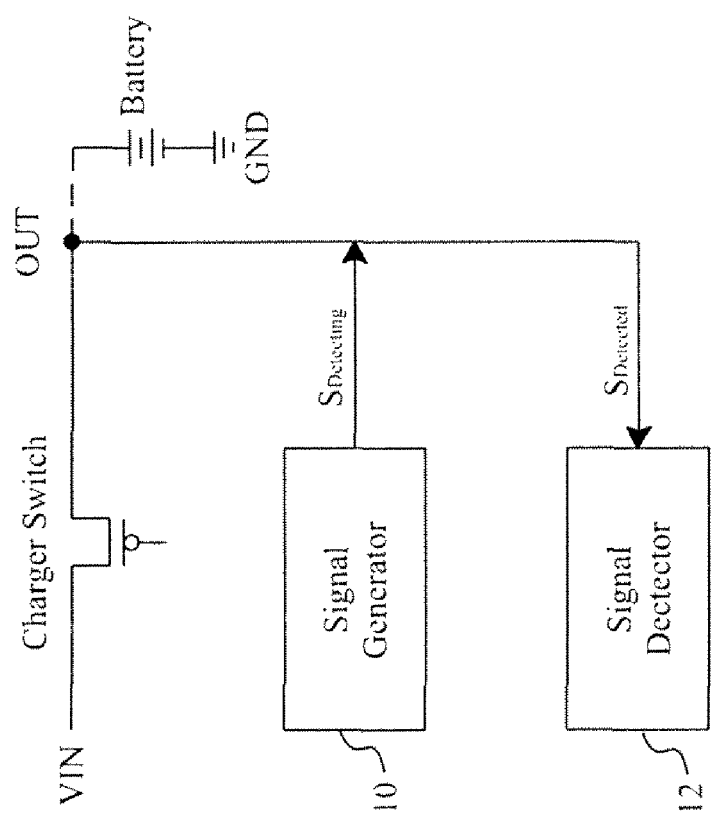
FIG. 1 is a block diagram of an embodiment according to the present invention.

FIG. 1 is a block diagram of an embodiment according to the present invention, in which a signal generator 10 and a signal detector 12 are connected to an output terminal OUT of a linear charger. The signal generator 10 provides a detecting signal $S_{Detecting}$ with a specific pattern applied onto the output terminal OUT, and the signal detector 12 monitors the output terminal OUT to thereby receive a detected signal $S_{Detected}$. The detected signal $S_{Detected}$ is used to determine if no battery is connected to the output terminal OUT, and accordingly, to turn off the charger switch or switch the charger to another operation mode, to stop supplying current to the output terminal OUT. The pattern of the detecting signal $S_{Detecting}$ may be preset by the system designer, and could be in any form only if it can be identified.

Figure 2:
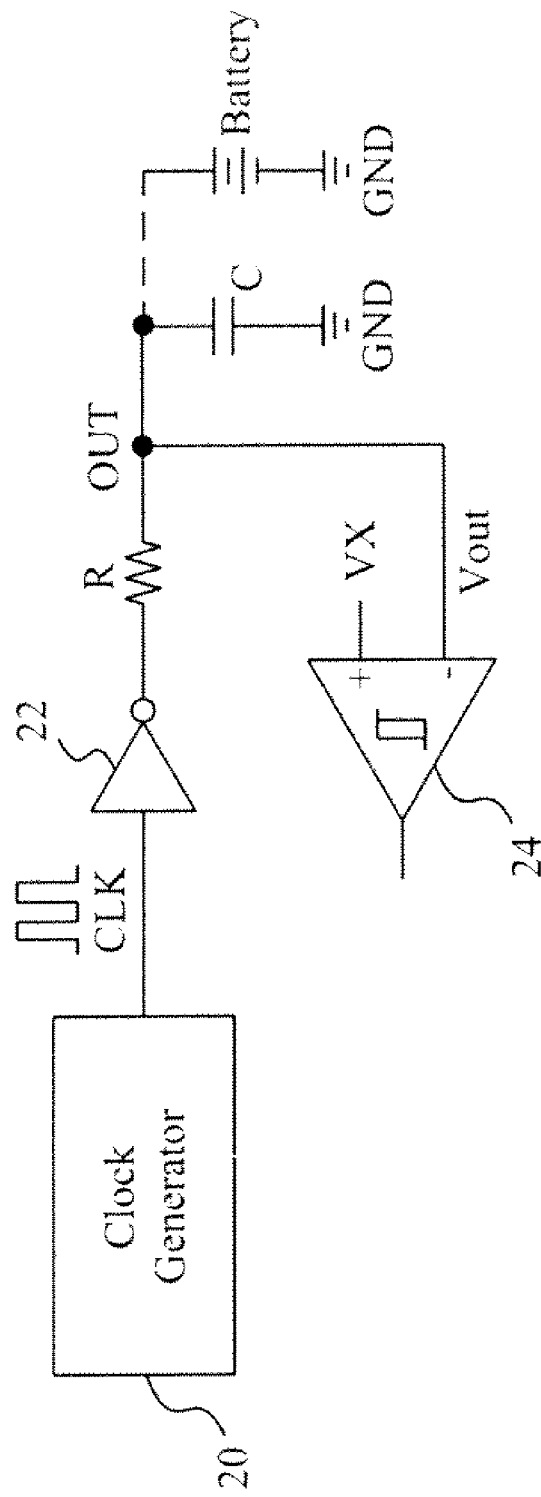
FIG. 2 is an embodiment circuit for the apparatus of FIG. 1.
Figure 3:
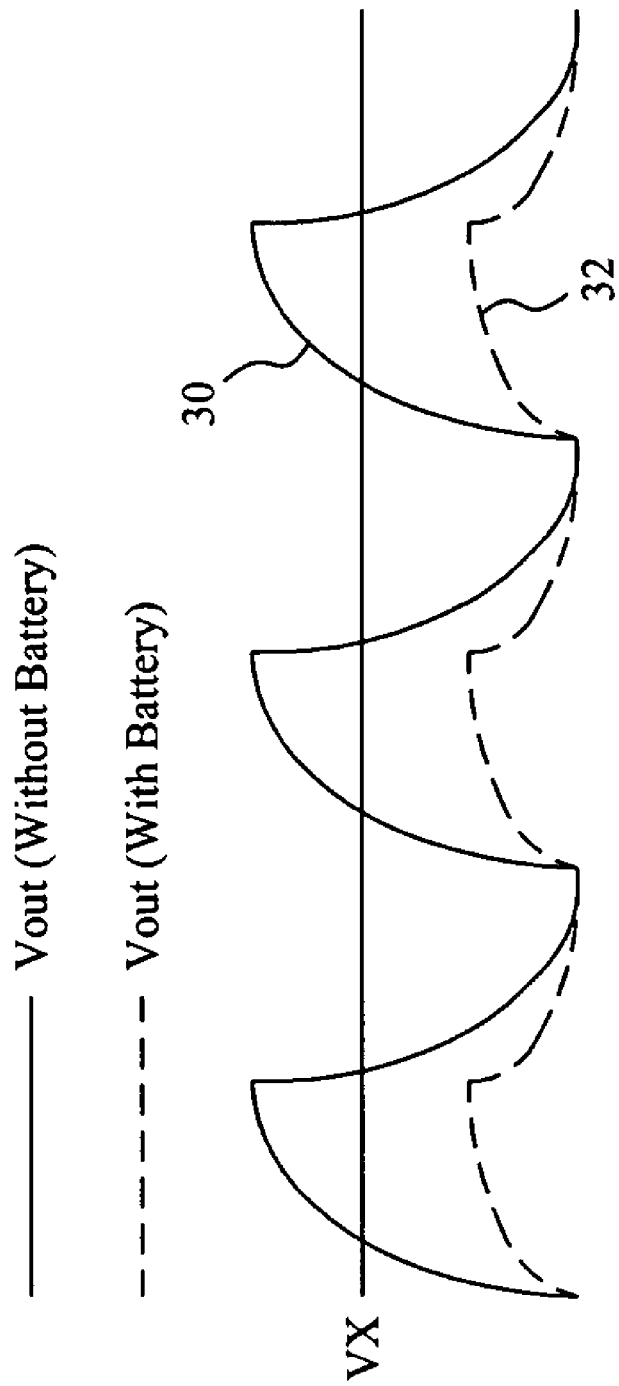
FIG. 3 is a waveform diagram showing the detected voltage in the circuit of FIG. 2.

FIG. 2 is an embodiment circuit for the apparatus of FIG. 1, the clock CLK provided by a clock generator 20 is applied to the output terminal OUT through a buffer 22 and a resistor R, and a hysterisis comparator 24 detects the clock CLK from the output terminal OUT. The clock generator 20 may be selected from the internal circuit of the charger, the resistor R may be one in the internal circuit of the charger, and the buffer 22 and the hysterisis comparator 24 may be also selected from the internal circuit of the charger. Hence, the circuit for detecting absent battery condition in a linear charger requires no external components. From an equivalent circuit, the output terminal OUT is connected with a capacitor C, where the capacitance C is about 100 µF when no battery is connected to the output terminal OUT, and is about 1 F when a battery is connected to the output terminal OUT. Since these two conditions will have a significant difference in capacitance C up to three order, the RC network will behave as a large filter when a battery is connected to the output terminal OUT. As shown in FIG. 3, when no battery is connected to the output terminal OUT, the detected voltage Vout includes a significant clock thereof, as shown by the waveform 30; whereas when a battery is connected to the output terminal OUT, the clock CLK is filtered by the RC filter such that the peak of the detected voltage Vout is lower than the reference voltage VX, as shown by the waveform 32. As a result, in no-battery condition, the hysterisis comparator 24 will detect the clock 30 higher than the reference voltage VX, and may correctly determine that no battery is connected to the output terminal OUT accordingly. In response thereto, the hysterisis comparator 24 triggers a no-battery signal to signal the charger to stop supplying current. The no-battery signal produced by the hysterisis comparator 24 may be also provided for other applications for the charger.

The circuit and method according to the present invention may be functional continuously or at some specific timing, for example the start-up of the charger system.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A circuit for detecting absent battery condition in a linear charger having an output terminal to supply a current to charge a battery, comprising:
   a signal generator connected to the output terminal, for providing a detecting signal to be applied onto the output terminal; and
   a signal detector connected to the output terminal, for monitoring the output terminal to thereby receive a detected signal therefrom, to determine if any battery is connected to the output terminal, and if determined that the battery is not connected to the output terminal, said current stops flowing to the output terminal;
   wherein the detected signal is characterized by a capacitance determined by the presence or absence of the battery.

2. The circuit of claim 1, wherein the signal generator comprises a clock generator for providing a clock as the detecting signal.

3. The circuit of claim 1, wherein the signal generator comprises a resistor connected to the output terminal.

4. The circuit of claim 1, wherein the signal detector comprises a hysterisis comparator for comparing the detected signal with a reference signal, to trigger a no-battery signal if the detected signal becomes lower than the reference signal.

5. A method for detecting absent battery condition in a linear charger having an output terminal to supply a current to charge a battery, comprising the steps of:
   A. applying a detecting signal onto the output terminal; and
   B. monitoring the output terminal to thereby receive a detected signal therefrom, to determine if any battery is connected to the output terminal, and if determined that the battery is not connected to the output terminal, said current stops flowing to the output terminal;
   wherein the detected signal is characterized by a capacitance determined by the presence or absence of the battery.

6. The method of claim 5, further comprising the step of generating a clock as the detecting signal.

7. The method of claim 5, wherein the step B comprises the steps of:
   comparing the detected signal with a reference signal; and
   triggering a no-battery signal if the detected signal becomes lower than the reference signal.

* * * * *